United States Patent
Han et al.

(10) Patent No.: US 6,774,826 B2
(45) Date of Patent: Aug. 10, 2004

(54) SYNCHRONIZATION CODE RECOVERY CIRCUIT AND METHOD

(75) Inventors: Sung-hyu Han, Seoul (KR); Yoon-woo Lee, Gyeonggi-do (KR); Joong-eon Seo, Gyeonggi-do (KR); Young-im Ju, Seoul (KR); Sang-hyun Ryu, Gyeonggi-do (KR); Sung-hee Hwang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/285,678

(22) Filed: Nov. 1, 2002

(65) Prior Publication Data

US 2003/0194036 A1 Oct. 16, 2003

(30) Foreign Application Priority Data

Apr. 12, 2002 (KR) ........................................ 2002-19967

(51) Int. Cl.[7] .............................................. H03M 9/00
(52) U.S. Cl. ...................... 341/100; 375/368; 714/798; 369/47.48
(58) Field of Search ......................... 341/100; 375/368, 375/371; 714/798; 369/47.22, 47.48

(56) References Cited

U.S. PATENT DOCUMENTS

| | | | | |
|---|---|---|---|---|
| 4,937,843 A | * | 6/1990 | Takemoto | .................. 375/368 |
| 5,461,633 A | * | 10/1995 | Kitamura | .................... 714/798 |
| 5,648,776 A | * | 7/1997 | Widmer | ...................... 341/100 |
| 5,757,869 A | * | 5/1998 | Sands et al. | ................ 375/366 |
| 6,377,643 B1 | * | 4/2002 | Lee et al. | .................. 375/368 |

* cited by examiner

Primary Examiner—Howard L. Williams
(74) Attorney, Agent, or Firm—Staas & Halsey LLP

(57) ABSTRACT

A circuit which recovers a synchronization code, and a method thereof. Where a synchronization code is not detected from an incoming bitstream, a plurality of synchronization code recovery candidate patterns are compared with an original synchronization pattern, and location data to produce an optimal synchronization pattern is determined and generated on the basis of a result of the comparison. The synchronization code is recovered to a location corresponding to the location data. Alternatively, where a synchronization code is not detected from an incoming bitstream, a plurality of synchronization code recovery candidate patterns are error-corrected, and location data to produce an optimal synchronization pattern is determined and generated on the basis of a result of the error correction. The synchronization code is recovered to a location corresponding to the location data. Accordingly, a damaged synchronization code can be recovered by inserting a synchronization code to a more accurate location, further increasing the reliability of data.

24 Claims, 8 Drawing Sheets

FIG. 4A ORIGINAL SYNCHRONIZATION CODE

FIG. 4B DAMAGED SYNCHRONIZATION CODE

FIG. 4C SIGNAL

FIG. 4D SYNCHRONIZATION CODE RECOVERY CANDIDATES: n CHANNEL BITS

FIG. 4E (n−k) CHANNEL BITS

FIG. 4F (n+k) CHANNEL BITS (k=1, 2, 3, ...)

FIG. 4G RECOVERED SYNCHRONIZATION CODE: (n−k) CHANNEL BITS

SYNCHRONIZATION CODE RECOVERY CIRCUIT AND METHOD

CROSS-REFERENCE TO RELATED APPLICATION

This application claims the benefit of Korean Patent Application No. 2002-19967 filed on Apr. 12, 2002, in the Korean Intellectual Property Office, the disclosure of which is incorporated herein by reference.

BACKGROUND OF THE INVENTION

1. Field of the Invention

The present invention relates to a circuit which reliably recovers a synchronization code in an optical disc system and a method thereof.

2. Description of the Related Art

Optical discs are widely used in the field of computers and home appliances as data storage media. During a fast optical disc playing operation, data errors are caused by technical restrictions, such as a fixed wavelength of a laser beam and a wobbling of a disc, during a disc rotation. Accordingly, a strong synchronization code for a data error must be detected to accurately playback an optical disc. Generally, a synchronization code is detected, protected and recovered using a window that is generated at synchronization intervals.

FIG. 1 shows a conventional synchronization code recovery circuit. The synchronization code recovery circuit includes a synchronization detector 1 which detects a synchronization code from an incoming bitstream, a window generator 2 which generates a window signal, a synchronization recoverer 3 which recovers the synchronization code, and a serial-to-parallel (S/P) converter 4 which converts serial data into parallel data. In this structure, the conventional synchronization code recovery circuit recovers a damaged synchronization code.

FIGS. 2A through 2D are timing diagrams of the synchronization code recovery circuit of FIG. 1. As shown in FIG. 2C, with reference to FIG. 1, the synchronization detector 1 detects a synchronization code from an incoming serial bitstream during a window, which is generated by the window generator 2. The incoming serial bitstream comprises synchronization codes and data which alternate one after another at every n channel bits. Where an original sync code shown in FIG. 2A is damaged, and a synchronization code is not detected by the synchronization detector 1 at a certain time as shown in FIG. 2B, the synchronization recoverer 3 recovers the synchronization code as shown in FIG. 2D. At this time, the synchronization code is recovered at a location exactly n channel bits apart from a location of a previous synchronization code.

Accordingly, the conventional synchronization code recovery circuit recovers a synchronization code at a fixed location. As such, where a channel bit does not match with a corresponding bit clock, the synchronization code is recovered to a wrong place. For example, a counter installed in the synchronization recoverer 3 may wrongly count by at least one channel bit. That is, where the counter in the synchronization recoverer 3 mistakes (n−k) or (n+k) channel bits for n channel bits, a wrongly recovered synchronization code affects the following data. Here, k denotes a positive integer.

Therefore, where a synchronization code is not detected within a fixed window period, the conventional synchronization code recovery circuit recovers the synchronization code to a location n channel bits apart from a location of a previous synchronization code. Hence, where n channel bits that are synchronized with bit clocks are not exactly counted, the synchronization code may not be recovered to its original location.

SUMMARY OF THE INVENTION

Accordingly, it is an object of the present invention to provide a circuit and a method of recovering a synchronization code to an accurate location.

Another object of the present invention is to provide a circuit and a method of recovering a synchronization code to an optimal location by comparing a plurality of synchronization code recovery candidates with an original synchronization code pattern.

Still another object of the present invention is to provide a circuit and a method of recovering a synchronization code to an optimal location by performing an error correction operation on a plurality of synchronization code recovery candidates.

Additional objects and advantages of the invention will be set forth in part in the description which follows and, in part, will be obvious from the description, or may be learned by practice of the invention.

To achieve the above and other objects of the present invention, there is provided a synchronization code recovery circuit comprising a synchronization detector, a next synchronization location data generator, and a synchronization recoverer. The synchronization detector detects a synchronization code from an incoming bitstream during a window equal to or longer than a synchronization period. The next synchronization location data generator obtains and compares a plurality of synchronization code recovery candidate patterns with an original synchronization pattern of the incoming bitstream in response to the synchronization code not being detected by the synchronization detector, and generates location data to produce an optimal synchronization pattern according to a result of the comparison. The synchronization recoverer recovers the synchronization code to a location corresponding to the location data.

To achieve the above and other objects of the present invention, there is also provided a synchronization code recovery circuit comprising a synchronization detector, a generator, and a synchronization recoverer. The synchronization detector detects a synchronization code from an incoming bitstream during a window equal to or longer than a synchronization period. The generator obtains and error-corrects a plurality of synchronization code recovery candidate patterns in response to the synchronization code not being detected by the synchronization detector, and generates location data to produce an optimal synchronization pattern according to a result of the error-correction. The synchronization recoverer recovers the synchronization code to a location corresponding to the location data.

To achieve the above and other objects of the present invention, there is provided a method of recovering a damaged synchronization code on an incoming bitstream. The method comprises detecting a synchronization code from the incoming bitstream during a window equal to or longer than a synchronization period, comparing a plurality of synchronization code recovery candidate patterns with an original synchronization pattern of the incoming bitstream in response to the synchronization code not being detected and generating location data to produce an optimal synchronization pattern according to the comparison, and recovering the synchronization code to a location corresponding to the location data.

To achieve the above and other objects of the present invention, there is provided another method of recovering a damaged synchronization code on an incoming bitstream. The method comprises detecting a synchronization code from the incoming bitstream during a window equal to or longer than a synchronization period, error-correcting a plurality of synchronization code recovery candidate patterns in response to the synchronization code not being detected and generating location data to produce an optimal synchronization pattern according to the error-correction, and recovering the synchronization code to a location corresponding to the location data.

BRIEF DESCRIPTION OF THE DRAWINGS

The above objects and advantages of the present invention will become more apparent by describing in detail preferred embodiments thereof with reference to the accompanying drawings in which.

DETAILED DESCRIPTION OF THE PREFERRED EMBODIMENTS

Figure 1:
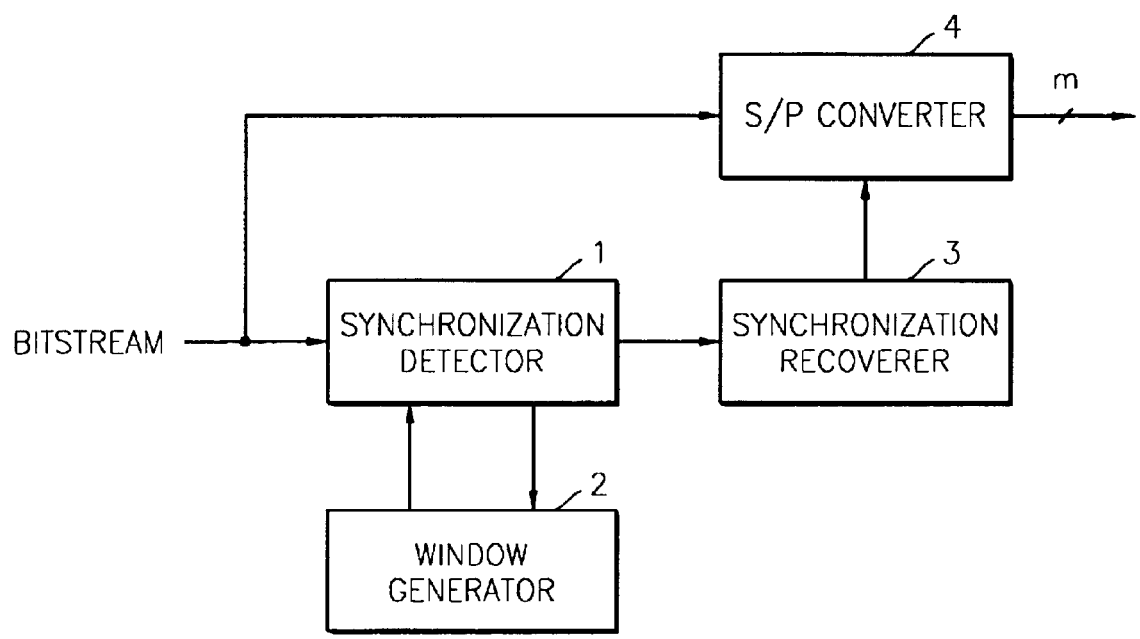
FIG. 1 is a block diagram of a conventional synchronization code recovery circuit.
Figures 2A, 2B, 2C, 2D:
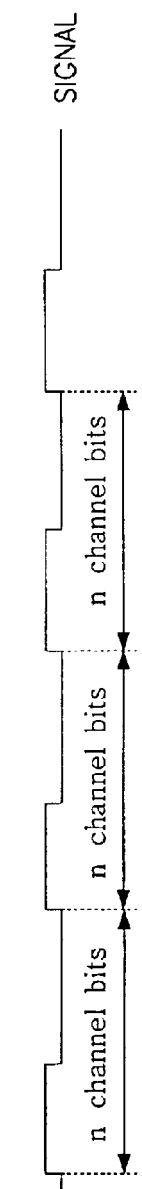
FIGS. 2A through 2D are timing diagrams of the synchronization code recovery circuit of FIG. 1.

Reference will now be made in detail to the embodiments of the present invention, examples of which are illustrated in the accompanying drawings, wherein like reference numerals refer to the like elements throughout. The embodiments are described below in order to explain the present invention by referring to the figures.

Figure 3:
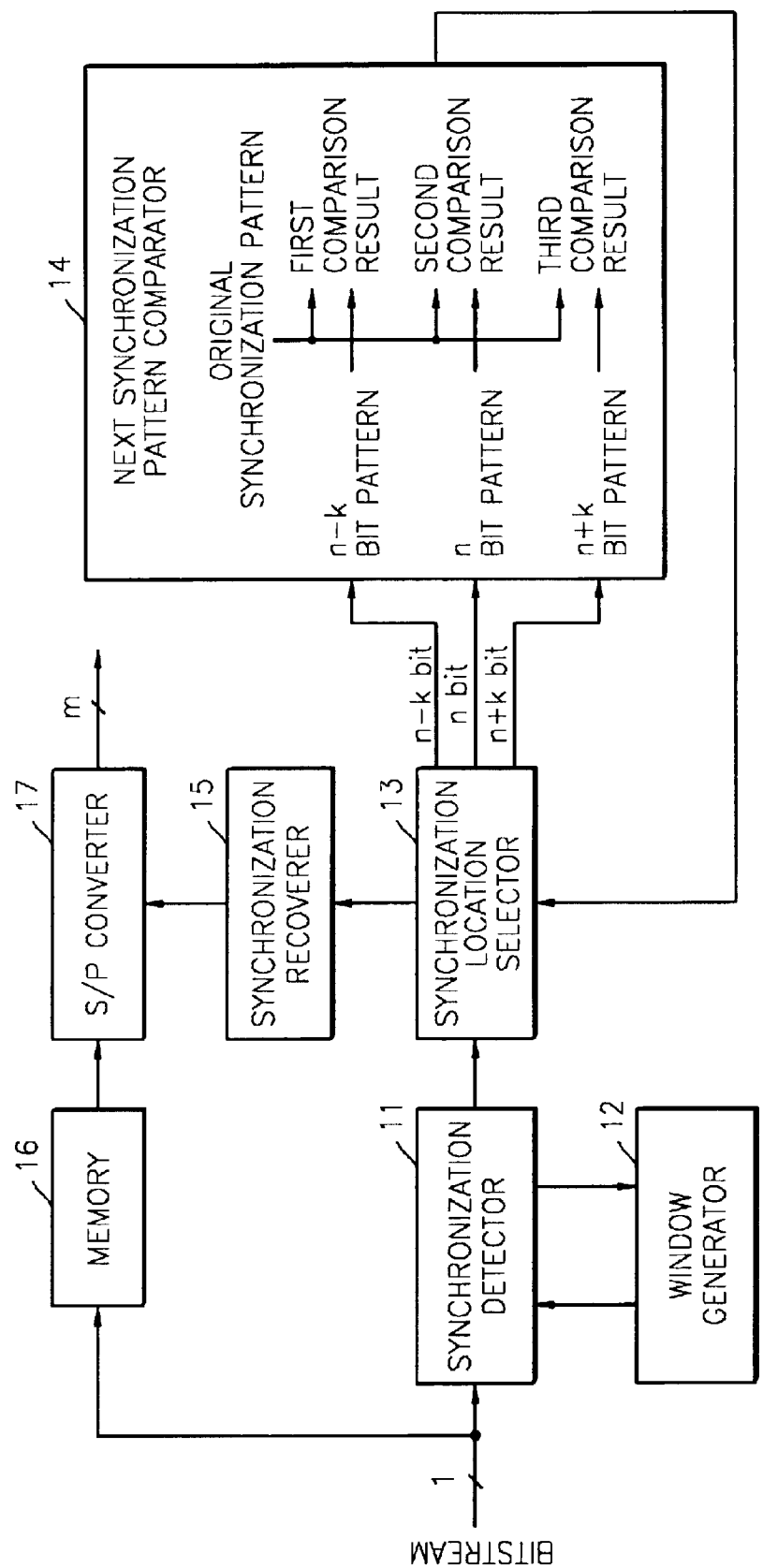
FIG. 3 is a block diagram of a synchronization code recovery circuit according to an embodiment of the present invention.

FIG. 3 shows a synchronization code recovery circuit according to an embodiment of the present invention. The synchronization code recovery circuit includes a synchronization detector 11, a window generator 12, a synchronization location selector 13, a next synchronization pattern comparator 14, a synchronization recoverer 15, a memory 16, and a serial-to-parallel (S/P) converter 17. FIGS. 4A through 4G show timing diagrams of the synchronization code recovery circuit of FIG. 3.

Figure 4:
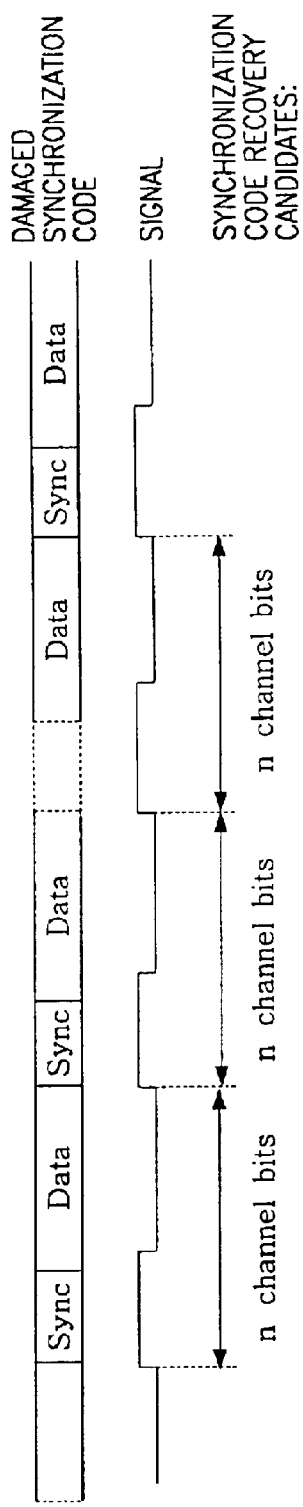
FIGS. 4A through 4G are timing diagrams of the synchronization code recovery circuit of FIG. 3.

The synchronization detector 11 detects a synchronization code from an incoming serial bitstream during a window, as shown in FIG. 4C, which is generated at intervals of n channel bits by the window generator 12. Where an original synchronization code shown in FIG. 4A is damaged and no synchronization code is detected in a certain period as shown in FIG. 4B, the synchronization detector 11 provides a detection control signal to the synchronization location selector 13. In response, the synchronization location selector 13 determines a value of k to determine a number of synchronization code recovery candidates having from (n−k) to (n+k) channel bits, respectively, and transmits the determined synchronization code recovery candidates to the next synchronization pattern comparator 14. Here, n and k denote positive integers. The synchronization code recovery candidates are obtained by varying a synchronization location, that is, the number of channel bits after which the synchronization code is to be inserted. For example, where n is 100 and k is 2, 5 synchronization code recovery candidates are generated. Those are candidates having 98 channel bits, 99 channel bits, 100 channel bits, 101 channel bits, and 102 channel bits, respectively, in front of a location to which the synchronization code is to be recovered.

The next synchronization pattern comparator 14 compares the received synchronization code recovery candidates, whose number depends on the value k determined by the synchronization location selector 13, with a pre-stored original synchronization pattern. For example, an n channel bit pattern of FIG. 4D, an (n−k) channel bit pattern of FIG. 4E, and an (n+k) channel bit pattern of FIG. 4F are compared with the original synchronization pattern. The next synchronization pattern comparator 14 transmits location data on an optimal synchronization pattern obtained based on the result of the comparison to the synchronization location selector 13. The location data is transferred to the synchronization recoverer 15. As shown in FIG. 4G, the synchronization code is recovered to a location corresponding to the location data, that is, after (n−k) channel bits.

The memory 16 temporally stores the incoming serial bitstream while the synchronization location selector 13, the next synchronization pattern comparator 14 and the synchronization recoverer 5 recovers the synchronization code to an optimal location. The S/P converter 17 outputs the serial bitstream read from the memory 16 and the synchronization code recovered by the synchronization recoverer 15 in a form of m-bit parallel data.

Figure 5:
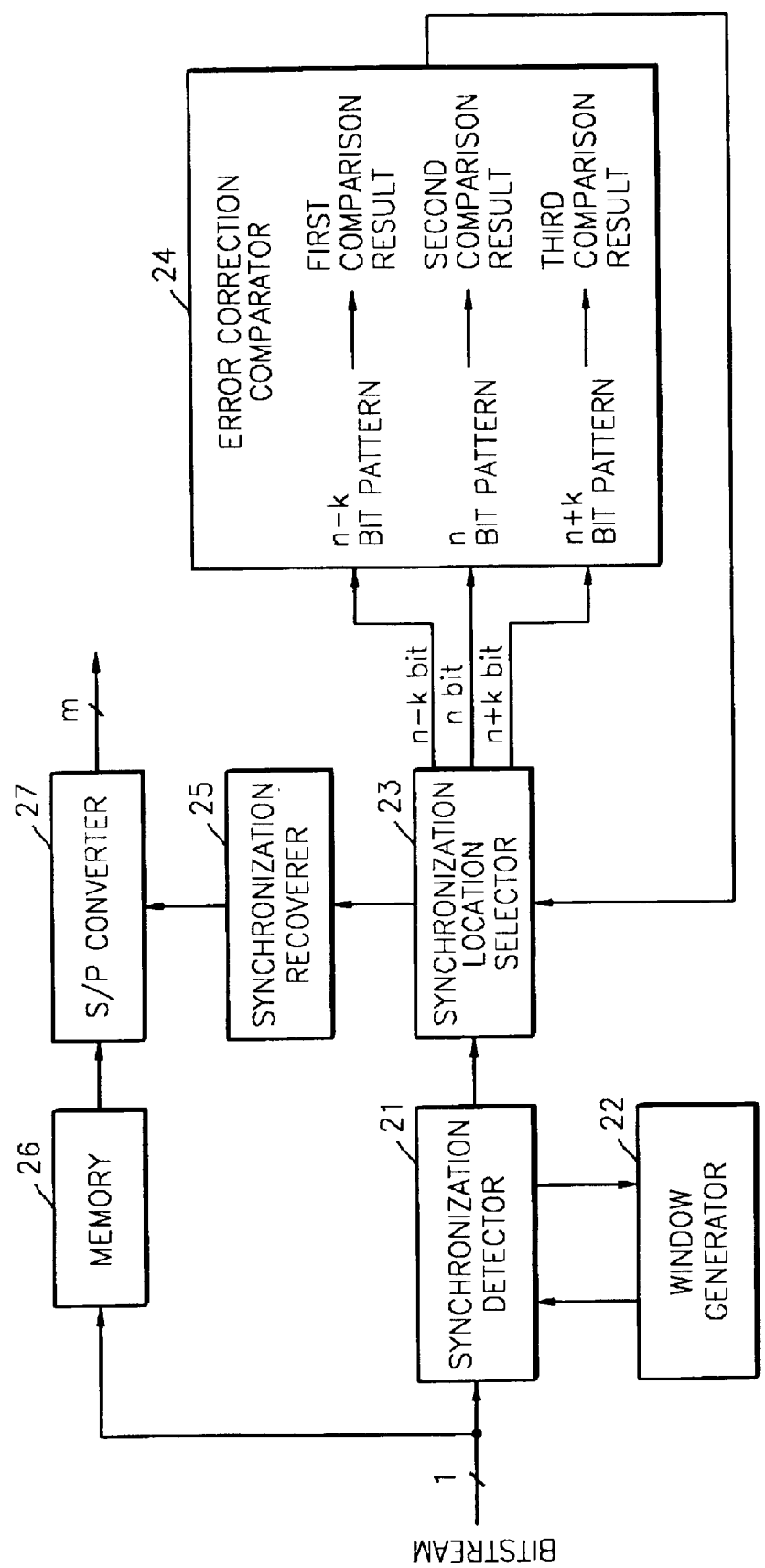
FIG. 5 is a block diagram of a synchronization code recovery circuit according to another embodiment of the present invention.

FIG. 5 shows a block diagram of a synchronization code recovery circuit according to another embodiment of the present invention. The synchronization code recovery circuit includes a synchronization detector 21, a window generator 22, a synchronization location selector 23, an error correction comparator 24, a synchronization recoverer 25, a memory 26, and an S/P converter 27. FIGS. 6A through 6G show timing diagrams of the synchronization code recovery circuit of FIG. 5.

Figure 6:
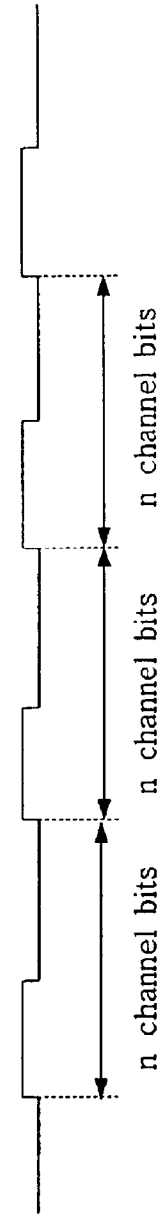
FIGS. 6A through 6G are timing diagrams of the synchronization code recovery circuit of FIG. 5.

The synchronization detector 21 detects a synchronization code from an incoming serial bitstream during a window, as shown in FIG. 6C, which is generated at intervals of n channel bits by the window generator 22. Where an original synchronization code of FIG. 6A is damaged and no synchronization code is detected in a certain period as shown in FIG. 6B, the synchronization detector 21 provides a detection control signal to the synchronization location selector 23. In response, the synchronization location selector 23 determines a value of k to determine a number of synchronization code recovery candidates having from (n−k) to (n+k) channel bits, respectively, and transmits the determined synchronization code recovery candidates to the error correction comparator 24. Here, n and k denote positive integers. The synchronization code recovery candidates are obtained by varying a synchronization location, that is, the number of channel bits after which the synchronization code is to be inserted. For example, where n is 100 and k is 2, 5 synchronization code recovery candidates are generated. Those are candidates having 98 channel bits, 99 channel bits, 100 channel bits, 101 channel bits, and 102 channel bits, respectively, in front of a location to which the synchronization code is to be recovered.

The error correction comparator 24 error-corrects the received synchronization code recovery candidates according to the determined value of k. For example, an n channel bit pattern of FIG. 6D, an (n–k) channel bit pattern of FIG. 6E, and an (n+k) channel bit pattern of FIG. 6F are error-corrected. The error correction comparator 24 transmits location data on an optimal synchronization pattern, which is obtained based on the result of the error-correction, to the synchronization location selector 23. The location data is transferred to the synchronization recoverer 25. In the synchronization recoverer 25, as shown in FIG. 6G, the synchronization code is recovered to a location corresponding to the location data, that is, after (n–k) channel bits. Upon performing the error-correction on the synchronization code recovery candidates, the error correction comparator 24 generates an error-correction enable signal with respect to an optimal synchronization code recovery candidate and error-correction disable signals for the other synchronization code recovery candidates. Accordingly, the location data of the optimal synchronization pattern is recognized based on the result of the error correction.

The memory 26 temporally stores the incoming serial bitstream while the synchronization code is recovered to an optimal location through the synchronization location selector 23, the error-correction comparator 24 and the synchronization recoverer 25. The S/P converter 27 outputs the serial bitstream read from the memory 26 and the synchronization code recovered by the synchronization recoverer 25 in a form of m-bit parallel data.

Figure 7:
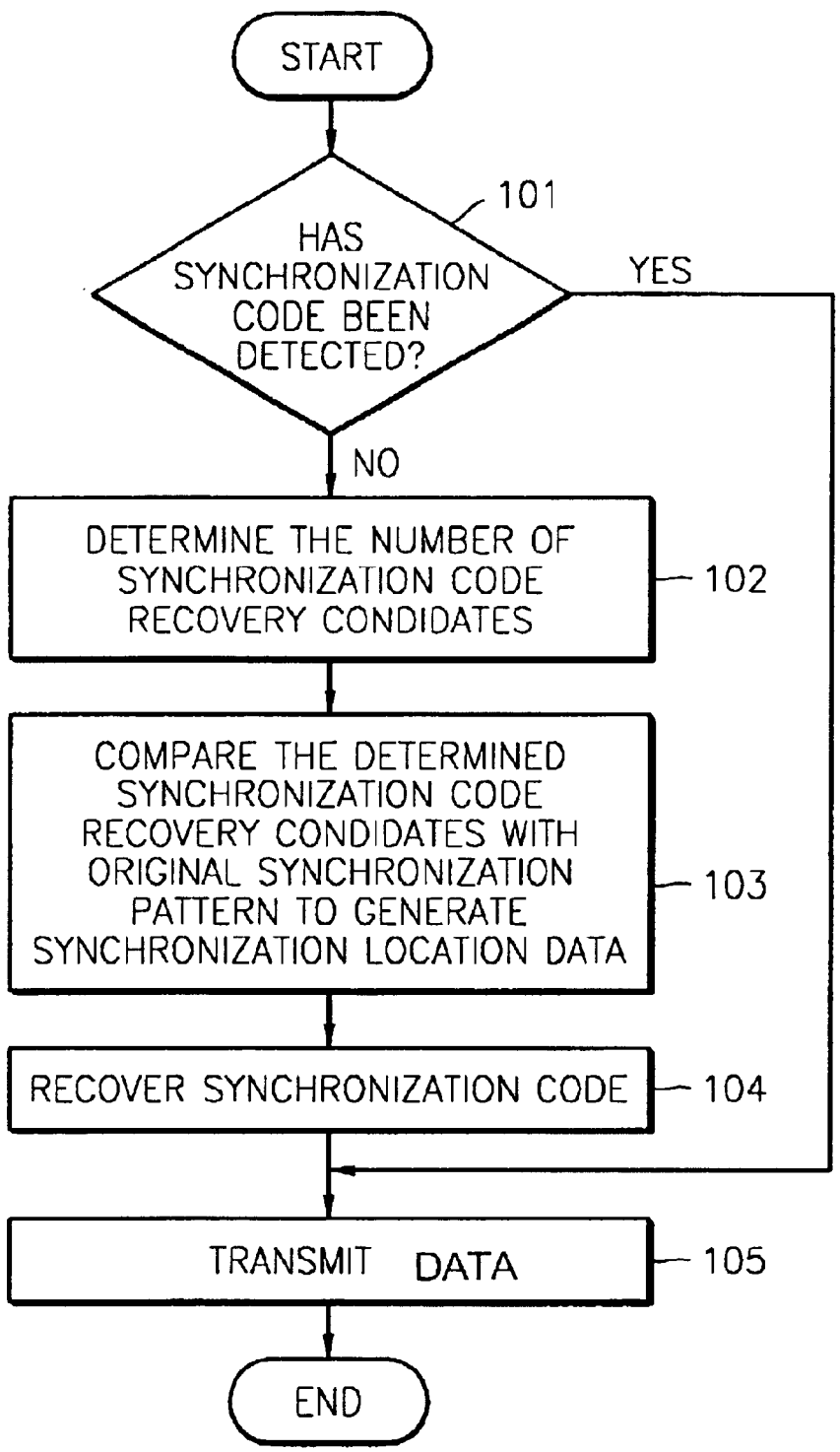
FIG. 7 is a flowchart illustrating a synchronization code recovery method utilized by the synchronization code recovery circuit of FIG. 3.

FIG. 7 shows a flowchart illustrating a synchronization code recovery method of the present invention, and will now be described in connection with the recovery circuit of FIG. 3.

Referring to FIG. 7, a determination is made whether the synchronization detector 11 has detected a synchronization code from an incoming bitstream during a window generated by the window generator 12, in operation 101. Where the synchronization code has been detected, the method proceeds to operation 105 to transmit data. Where the synchronization code has not been detected, the synchronization location selector 13 determines a value of k to determine a number of synchronization code recovery candidates having from (n–k) to (n+k) channel bits, respectively, after which the synchronization code is to be inserted, in operation 102. Thereafter, the next synchronization pattern comparator 14 compares the determined synchronization code recovery candidates, whose number depends on the value k, with an original synchronization pattern, and outputs location data of an optimal synchronization candidate, which is determined on the basis of the comparison result, to the synchronization location selector 13, in operation 103. The synchronization recoverer 15 recovers the synchronization code to an optimal location corresponding to the location data output from the synchronization location selector 13, in operation 104. The S/P converter 17 transmits the serial bitstream read from the memory 16 and the synchronization code recovered by the synchronization recoverer 15 in a form of parallel data, in operation 105.

Figure 8:
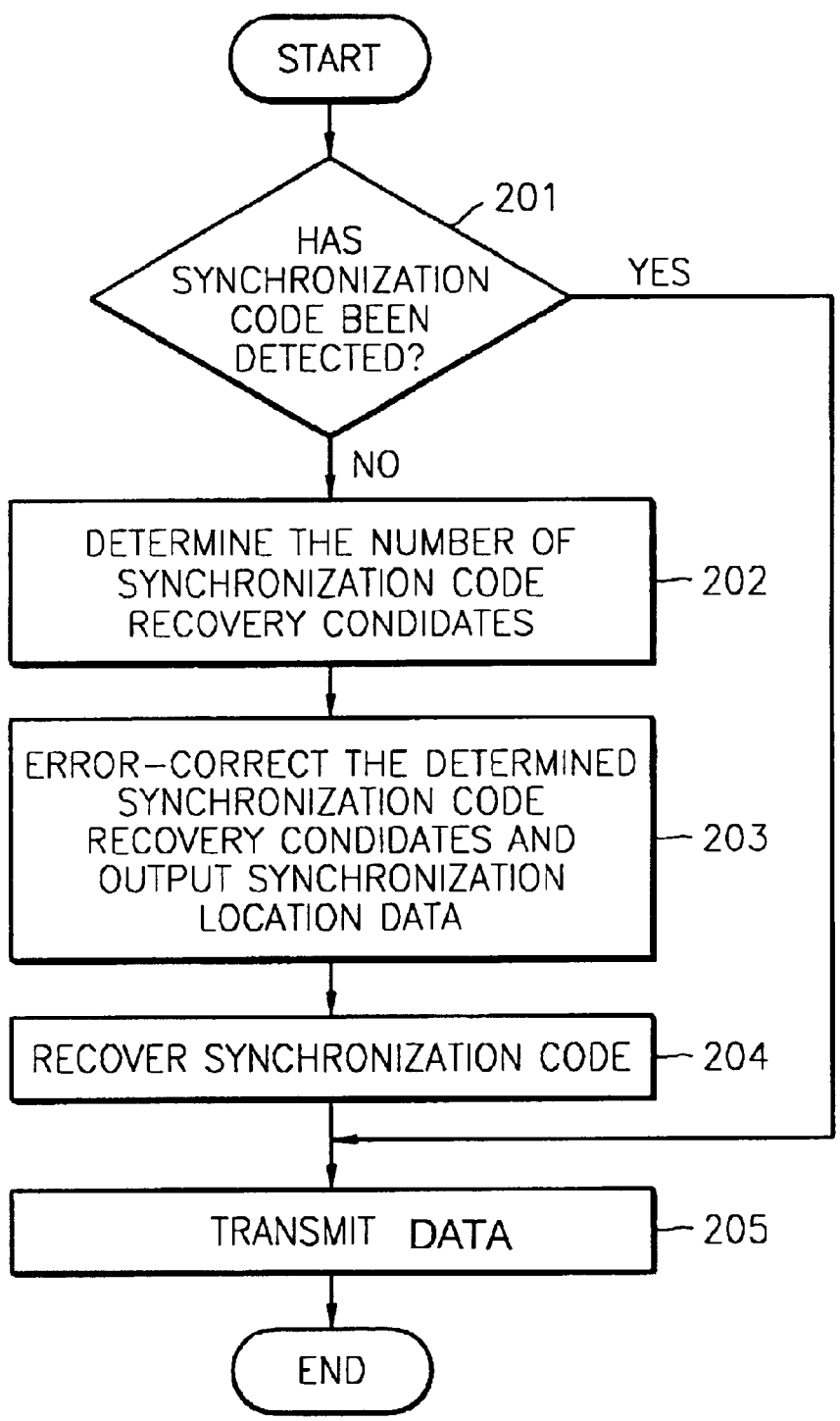
FIG. 8 is a flowchart for illustrating a synchronization code recovery method utilized by the synchronization code recovery circuit of FIG. 5.

FIG. 8 shows a flowchart illustrating another synchronization code recovery method of the present invention, and will now be described in connection with the recovery circuit of FIG. 5.

Referring to FIG. 8, a determination is made whether the synchronization detector 21 has detected a synchronization code from an incoming bitstream during a window generated by the window generator 22, in operation 201. Where the synchronization code has been detected, the method proceeds to operation 205 to transmit data. Where the synchronization code has not been detected, the synchronization location selector 23 determines a value of k to determine a number of synchronization code recovery candidates having from (n–k) to (n+k) channel bits, respectively, after which the synchronization code is to be inserted, in operation 202. Thereafter, the error correction comparator 24 error-corrects the determined synchronization code recovery candidates, the number of which depends on the determined value of k, and outputs location data of an optimal synchronization candidate, which is determined on the basis of the error-correction result, to the synchronization location selector 23, in operation 203. Upon performing the error-correction on the synchronization code recovery candidates, the error correction comparator 24 generates an error-correction enable signal with respect to an optimal synchronization code recovery candidate and error-correction disable signals for the other synchronization code recovery candidates, so as to recognize the location data of the optimal synchronization pattern based on the result of the error correction. The synchronization recoverer 25 recovers the synchronization code to an optimal location corresponding to the location data output from the synchronization location selector 23, in operation 204. The S/P converter 27 transmits the serial bitstream read from the memory 26 and the synchronization code recovered by the synchronization recoverer 25 in a form of parallel data, in operation 205.

Although the present invention is described with respect to a field of optical disc systems, it is understood that the present invention can be applied to a field of data processing for detecting and recovering a synchronization code using a window.

In the present invention, the probability of recovering a synchronization code to its original location is increased even where n channel bits are not accurately counted. Additionally, since a damaged synchronization code is recovered by inserting a synchronization code into a more accurate location, the reliability of data is further increased.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A synchronization code recovery circuit comprising:
   a synchronization detector which detects a synchronization code from a bitstream input during a window equal to or longer than a synchronization period;
   a next synchronization location data generator which obtains and compares a plurality of synchronization code recovery candidate patterns with an original synchronization pattern of the bitstream in response to the synchronization code not being detected by the synchronization detector, and generates location data to produce an optimal synchronization pattern according to a result of the comparison; and
   a synchronization recoverer which recovers the synchronization code to a location corresponding to the location data.

2. The synchronization code recovery circuit of claim 1, wherein:
the bitstream comprises synchronization codes and data which are alternated at every n channel bits, and
the synchronization code recovery candidate patterns are obtained by recovering the synchronization code to a location after a predetermined number of channel bits, the number of which ranges from (n−k) to (n+k), where n and k denote positive integers.

3. The synchronization code recovery circuit of claim 2, wherein the next synchronization location data generator comprises:
a synchronization location selector which determines a number of the synchronization code recovery candidate patterns depending on a value of k in response to the synchronization code not being detected by the synchronization detector; and
a next synchronization pattern comparator which compares the determined synchronization code recovery candidate patterns with the original synchronization pattern and generates the location data to produce the optimal synchronization pattern.

4. The synchronization code recovery circuit of claim 1, further comprising:
a memory which temporarily stores the bitstream until the next synchronization location data generator generates the location data;
a window generator which generates the window; and
a serial-to-parallel converter which converts the bitstream read from the memory and the synchronization code recovered by the synchronization recoverer into parallel data.

5. A synchronization code recovery circuit comprising:
a synchronization detector which detects a synchronization code from a bitstream input during a window equal to or longer than a synchronization period;
a generator which obtains and error-corrects a plurality of synchronization code recovery candidate patterns in response to the synchronization code not being detected by the synchronization detector, and generates location data to produce an optimal synchronization pattern according to a result of the error-correction; and
a synchronization recoverer which recovers the synchronization code to a location corresponding to the location data.

6. The synchronization code recovery circuit of claim 5, wherein:
the bitstream comprises synchronization codes and data which are alternated at every n channel bits, and
the synchronization code recovery candidate patterns are obtained by recovering the synchronization code to a location after a predetermined number of channel bits, the number of which ranges from (n−k) to (n+k), where n and k denote positive integers.

7. The synchronization code recovery circuit of claim 6, wherein the generator comprises:
a synchronization location selector which determines a number of the synchronization code recovery candidate patterns depending on a value of k in response to the synchronization code not being detected by the synchronization detector; and
an error correction comparator which error-corrects the determined synchronization code recovery candidate patterns and generates the location data to produce the optimal synchronization pattern for which an error correction enable signal is generated as the result of the error correction.

8. The synchronization code recovery circuit of claim 5, further comprising:
a memory which temporarily stores the bitstream until the generator generates the location data;
a window generator which generates the window; and
a serial-to-parallel converter which converts the bitstream read from the memory and the synchronization code recovered by the synchronization recoverer into parallel data.

9. A method of recovering a damaged synchronization code on an incoming bitstream, the method comprising:
detecting a synchronization code from the incoming bitstream during a window equal to or longer than a synchronization period;
comparing a plurality of synchronization code recovery candidate patterns with an original synchronization pattern of the incoming bitstream in response to the synchronization code not being detected, and generating location data to produce an optimal synchronization pattern according to the comparison of the synchronization code recovery candidate patterns with the original synchronization pattern; and
recovering the synchronization code to a location corresponding to the location data.

10. The method of claim 9, wherein:
the incoming bitstream comprises synchronization codes and data which are alternated at every n channel bits, and
the synchronization code recovery candidate patterns are obtained by recovering the synchronization code to a location after a predetermined number of channel bits, the number of which ranges from (n−k) to (n+k), where n and k denote positive integers.

11. The method of claim 10, wherein the comparing of the synchronization code recovery candidate patterns with the original synchronization pattern and the generating of the location data comprises:
determining a number of the synchronization code recovery candidate patterns depending on a value of k in response to the synchronization code not being detected; and
comparing the determined synchronization code recovery candidate patterns with the original synchronization pattern and generating the location data to produce the optimal synchronization pattern.

12. The method of claim 9, further comprising:
temporarily storing the incoming bitstream until the location data is generated; and
transmitting the temporarily stored bitstream and the recovered synchronization code in a form of parallel data.

13. A method of recovering a damaged synchronization code on an incoming bitstream, the method comprising:
detecting a synchronization code from the incoming bitstream during a window equal to or longer than a synchronization period;
error-correcting a plurality of synchronization code recovery candidate patterns in response to the synchronization code not being detected, and generating location data to produce an optimal synchronization pattern according to a result of the error-correcting of the synchronization code recovery candidate patterns; and
recovering the synchronization code to a location corresponding to the location data.

14. The method of claim 13, wherein:

the incoming bitstream comprises synchronization codes and data which are alternated at every n channel bits, and the synchronization code recovery candidate patterns are obtained by recovering the synchronization code to a location after a predetermined number of channel bits, the number of which ranges from (n–k) to (n+k), where n and k denote positive integers.

15. The method of claim 14, wherein the error-correcting of the synchronization code recovery candidate patterns and the generating of the location data comprises:

determining a number of the synchronization code recovery candidate patterns depending on a value of k in response to the synchronization code not being detected; and error-correcting the determined synchronization code recovery candidate patterns and generating the location data to produce the optimal synchronization pattern.

16. The method of claim 13, further comprising:

temporarily storing the incoming bitstream until the location data is generated; and transmitting the temporarily stored bitstream and the recovered synchronization code in a form of parallel data.

17. The synchronization code recovery circuit of claim 1, wherein:

the bit stream comprises synchronization codes and data which are alternated at every n channel bits, and the synchronization code recovery candidate patterns are obtained from (n–K) to (n+k) channel bits of the bitstream, where n and k denote positive integers, after which the synchronization code is to be inserted.

18. The synchronization code recovery circuit of claim 1, wherein:

the bit stream comprises synchronization codes and data which are alternated at every n channel bits, and the synchronization code recovery candidate patterns are obtained by varying a synchronization location of the bitstream, so as to generate (n–K) to (n+k) channel bits, where n and k denote positive integers, after which the synchronization code is to be inserted.

19. The synchronization code recovery circuit of claim 5, wherein:

the bit stream comprises synchronization codes and data which are alternated at every n channel bits, and the synchronization code recovery candidate patterns are obtained from (n–K) to (n+k) channel bits of the bitstream, where n and k denote positive integers, after which the synchronization code is to be inserted.

20. The synchronization code recovery circuit of claim 5, wherein:

the bit stream comprises synchronization codes and data which are alternated at every n channel bits, and the synchronization code recovery candidate patterns are obtained by varying a synchronization location of the bitstream, so as to generate (n–K) to (n+k) channel bits, where n and k denote positive integers, after which the synchronization code is to be inserted.

21. The synchronization code recovery circuit of claim 7, wherein the error correction comparator generates the error correction enable signal corresponding to the optimal synchronization pattern, which is obtained from the synchronization code recovery candidate patterns, and generates error correction disable signals for the remaining synchronization code recovery candidate patterns.

22. The method of claim 9, wherein:

the bit stream comprises synchronization codes and data which are alternated at every n channel bits, and the synchronization code recovery candidate patterns are obtained by varying a synchronization location of the bitstream, so as to generate (n–K) to (n+k) channel bits, where n and k denote positive integers, after which the synchronization code is to be inserted.

23. The method of claim 13, wherein:

the bit stream comprises synchronization codes and data which are alternated at every n channel bits, and the synchronization code recovery candidate patterns are obtained by varying a synchronization location of the bitstream, so as to generate (n–K) to (n+k) channel bits, where n and k denote positive integers, after which the synchronization code is to be inserted.

24. The method of claim 15, wherein the error-correcting of the synchronization code recovery candidate patterns and the generating of the location data includes generating an error correction enable signal corresponding to the optimal synchronization pattern, which is obtained from the synchronization code recovery candidate patterns, and error correction disable signals for the remaining synchronization code recovery candidate patterns.

* * * * *